United States Patent
Berstis

(10) Patent No.: US 7,760,192 B2
(45) Date of Patent: Jul. 20, 2010

(54) CADENCE CONTROLLED ACTUATOR

(75) Inventor: Viktors Berstis, Austin, TX (US)

(73) Assignee: International Business Machines Corporation, Armonk, NY (US)

(*) Notice: Subject to any disclaimer, the term of this patent is extended or adjusted under 35 U.S.C. 154(b) by 1274 days.

(21) Appl. No.: 11/266,666

(22) Filed: Nov. 3, 2005

(65) Prior Publication Data

US 2007/0095636 A1    May 3, 2007

(51) Int. Cl.
*G06F 3/045* (2006.01)
(52) U.S. Cl. .................................. 345/174; 362/205
(58) Field of Classification Search ............ 345/39, 345/82, 691, 173, 174; 375/239; 307/141.4; 178/18.01, 18.04, 18.06; 362/205
See application file for complete search history.

(56) References Cited

U.S. PATENT DOCUMENTS

| | | | |
|---|---|---|---|
| 1,647 A | 6/1840 | Morse | |
| RE79 E | 1/1846 | Morse | |
| RE117 E | 6/1848 | Morse | |
| RE118 E | 6/1848 | Morse | |
| 5,142,569 A * | 8/1992 | Peters et al. | 379/207.16 |
| 5,347,261 A | 9/1994 | Adell | |
| 5,483,593 A * | 1/1996 | Gupta et al. | 379/386 |
| 6,147,719 A * | 11/2000 | Shafer | 348/734 |
| 6,530,672 B2 | 3/2003 | Galli | |
| 6,603,221 B1 * | 8/2003 | Liu | 307/125 |
| 6,709,129 B2 | 3/2004 | Galli | |
| 6,820,056 B1 | 11/2004 | Harif | |
| 6,890,086 B2 | 5/2005 | Shiu | |
| 2002/0167699 A1 | 11/2002 | Verplaetse et al. | |
| 2004/0169674 A1 | 9/2004 | Linjama | |
| 2004/0233158 A1 | 11/2004 | Stavely et al. | |
| 2004/0257253 A1 * | 12/2004 | Jones et al. | 341/143 |
| 2005/0152137 A1 | 7/2005 | Opolka | |
| 2005/0188821 A1 * | 9/2005 | Yamashita et al. | 84/611 |
| 2006/0071912 A1 | 4/2006 | Hill et al. | |
| 2006/0097983 A1 | 5/2006 | Haggman et al. | |

OTHER PUBLICATIONS

Non-final office action dated Jan. 14, 2010 for U.S. Appl. No. 11/609,028.
ITU-R Recommended Standard M.1677 International Morse Code, Mar. 2006.
N. Harrington, "Knock-based Commands for your Linux Laptop," IBM Developer Works Publication, Jul. 25, 2006, 11 pages.

* cited by examiner

*Primary Examiner*—Chanh Nguyen
*Assistant Examiner*—Kwang-Su Yang
(74) *Attorney, Agent, or Firm*—Yee & Associates, P.C.; William H. Steinberg

(57) ABSTRACT

Signals in a proper cadence are recognized as meeting criteria. Such signals are received from a touch plate coupled to a touch circuit. A controller discriminates against spurious signals if such signals are outside an initial tolerance, that is, are faster or slower than a device operator would enter such signals. Providing the criteria for an initial tolerance and a match tolerance are met, the controller actuates a device, such as a light emitting diode.

20 Claims, 4 Drawing Sheets

CADENCE CONTROLLED ACTUATOR

BACKGROUND OF THE INVENTION

1. Field of the Invention

The present invention relates generally to user interfaces, and in particular to a minimalist toggle circuit to actuate emitting devices between states.

2. Description of the Related Art

A frequent problem encountered in providing for switches is assuring durability of the switch. Circuit designers often take into account heavy use or exposure to hostile elements, among other things. A common technique designers use is to eliminate mechanical parts in favor of solid state circuit components.

Flashlight manufacturing has undergone a recent shift in technology used. In the 1990s the lowering cost of the light emitting diode, a technology commonly known as LED, made it possible to replace the incandescent bulb with the cooler-running, more durable LED. The shift in the industry is so fundamental that heavy-duty lamps are being retrofitted with LEDs, especially in the traffic signal application area. These LEDs are finding their way into automotive applications and have for many years now, been the preferred method of illuminating cockpits in newly manufactured aircraft.

The massive improvement has led designers to replace the emitting component of flashlights with LEDs. LEDs have a lifetime at least 10 times that of the incandescent bulbs that are replaced. Unfortunately, designers have not yet provided a similarly durable switch, and many flashlights now made have mechanical switches that fail long before the failure of the emitters or even the batteries commonly used to power the flashlight.

Occasionally, users of devices much more complicated than a flashlight may benefit by having a simple code that may enable the device owner to operate the device, but hinder others from using the device. For example, cars may employ a key-code to access a door without use of a conventional key. In addition, mobile devices such as cellular telephones and portable audio devices employ a lock-out mechanism. For those applications that do not require a particularly heavy and complicated code, it would be convenient to have some simplified gesture or user interface to authenticate the user, and reduce part counts to implement such a user interface.

A frequent application of touch circuits is the wall mounted elevator-summoning button. Often designers use such circuits within an elevator itself. Since such circuits seldom fail, the use of the circuit creates a good user experience, since there tends to be a presumption that if the electronics of the elevator work well, then there is a high probability of exiting the elevator unscathed.

Touch circuits are a class of circuit that operates by touching a plate with a substantial conductor, often a limb of the human body. Such circuits even operate if a glove is interposed between a hand and the plate or if the hand approaches extremely proximal to the switch. Extremely proximal means on the order of a millimeter. One type of touch circuit operates because the presence of the human body induces a capacitance on the plate, which changes the circuit in a well-known manner.

Another type of touch circuit detects the presence of a conductor by noting a change in the antenna-like qualities of the plate. Many other types of touch circuits have been used and are well known in the industry. All such circuits have a common feature, a conductive plate.

The touch circuits are well suited to the wall-mount application of an elevator. However, touch circuits, when used on small personal devices, suffer in that users may accidentally actuate the controlled device by the merest touch of their body, or even by contact with pocket change. Some manufacturers supplement their touch user interface with a mechanical switch that must be properly set prior to activation of the conductive plate or plates of the touch circuit controlled user interface. Such mechanical switches add to the cost of the device, and are susceptible to mechanical failure. Moreover, such mechanical switches tend to create additional unsealed openings in a device that tend to make such a device more susceptible to the corrosive effects of moist environments.

Airport runway lighting activates when a transmitter, using standard frequencies, is keyed on in one of several sequences. Such 'keying on' is often described as a pilot clicking on the microphone associated with the aircraft transmitter. Three clicks transmitted and received causes the runway controller circuit to set the runway lighting to the lowest level of illumination. The lighting systems only permit turning on the runway lights. To conserve power, the runway lighting systems operate on a timer, such that after an interval, usually 15 minutes, the runway lights are turned off without pilot input. The rationale for permitting only turning on lights is to prevent pranksters from disabling runway lighting by clicking on aviation radios. Particularly in this era of high vigilance concerning aviation, limiting access to airport facilities is a high priority. A downside to this mechanism is that several airports in the same region have the runway lighting system tuned to the same frequencies. Consequently, a pilot within range of two such systems can inadvertently signal a second runway lighting system to turn on. It is unknown for such runway lighting systems to screen out unusually rapid clicking of the microphone. More details are available in the Aeronautical Information Manual, Chapter 2, Section 1 (2-1-7).

SUMMARY OF THE INVENTION

The aspects of the present invention provide a method and apparatus for dispatching a signal to a controlled device. A first edge is received and a second edge is received within an initial tolerance of the first edge. A third edge is received within a match tolerance of the second edge. Based on receiving the first edge within the initial tolerance and also receiving the third edge within the match tolerance, a controller actuates the controlled device.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
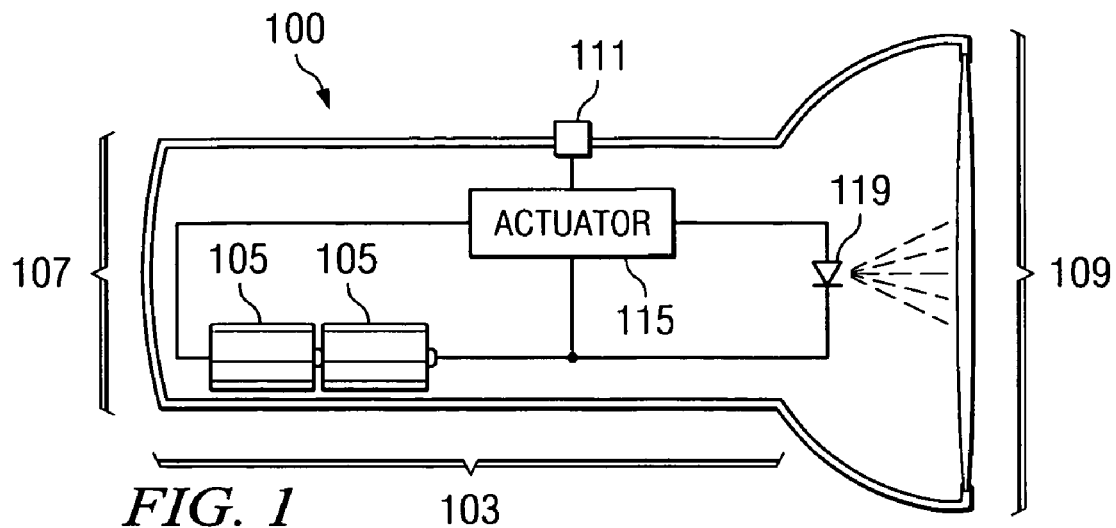
FIG. 1 shows a cut-away diagram of a flashlight in accordance with an illustrative embodiment of the present invention.

FIG. 1 shows a cut-away diagram of a flashlight in accordance with an illustrative embodiment of the present invention. Flashlight 100 may use the outward shape of conventional flashlights including handle area 103 which may provide storage for one or more batteries 105. Since flashlight 100 may have an elongated form, flashlight 100 may have distal ends: butt end 107 and lens end 109, which are distal to each other. Touch plate 111 may be positioned near one of the distal ends such that, when the handle is grasped, touch plate 111 is near where the hand holds the flashlight.

Flashlight 100 contains actuator 115, which connects to touch plate 111. Actuator 115 also connects to a negative voltage battery end and a positive voltage battery end. Actuator 115 provides switching control to an emitter, for example, light emitting diode or LED 119. Actuator 115 may be constructed as an application specific integrated circuit (ASIC). Actuator 115 may, like many touch switches, detect the difference in the capacitance of touch plate 111 when touched by a finger versus the parasitic capacitance of the plate alone.

Thus, a user may readily trigger detectable signals at actuator 115. Actuator 115, thus relies on no parts that move relative to each other as far as touch plate 111 is concerned. In addition, actuator 115 rejects signals that fail to meet a predetermined timing or cadence, for example, spurious contact with change or the hip, as happens when flashlight 100 is kept in a user's pocket.

Figure 2A:
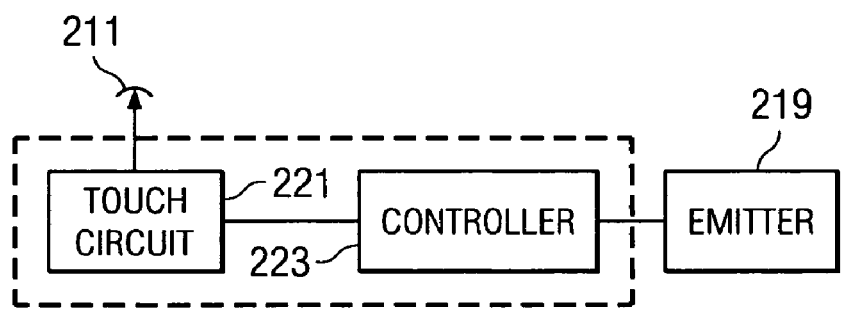
FIG. 2A shows a block diagram of an emitting device in accordance with an illustrative embodiment of the present invention.

FIG. 2A shows a block diagram of an emitting device in accordance with an illustrative embodiment of the present invention. The diagram is a generalized view of the flashlight of FIG. 1, among other things. Touch plate 211 is coupled to touch circuit 221. Touch circuit 221 may provide a pulse to controller unit 223 when conditions change at touch plate 211. For example, touch circuit 221 may provide a pulse for the duration that a conductor changes the capacitance of touch plate 211 beyond a certain threshold. As discussed, the capacitance may change in response to a large conductor, for example, a human finger, becoming proximal to touch plate 211. As used in this application, touch means sufficiently proximal to the touch plate, allowing for intervening fabric and other materials, that touch circuit 221 is triggered. Provided that controller unit 223 in FIG. 2A receives a signal meeting one or more criteria, controller unit 223 in FIG. 2A actuates emitter 219. Controller unit 223 may be comprised of a first controller, a second controller, and a third controller. A designer may build each controller within the same enclosure, or in separate enclosures. First controller may receive a first edge and process the edge. Second controller may receive a second edge and process the second edge. Third controller may receive a third edge and process the third edge.

Figure 2B:
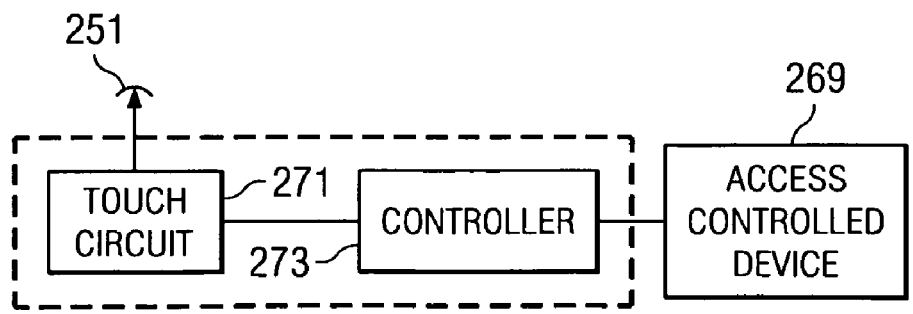
FIG. 2B shows a block diagram of an access control device in accordance with an illustrative embodiment of the present invention.

FIG. 2B shows a block diagram of an access controlled device in accordance with an illustrative embodiment of the present invention. Access controlled device 269 may be, for example, a mobile telephone, an automobile, or a portable audio device. Touch plate 251 is coupled to touch circuit 271. Touch circuit 271 may provide a pulse to controller 273 when conditions change at touch plate 251. For example, touch circuit 271 may provide a pulse for the duration that a conductor changes the capacitance of touch plate 251 beyond a certain threshold.

Figure 3:
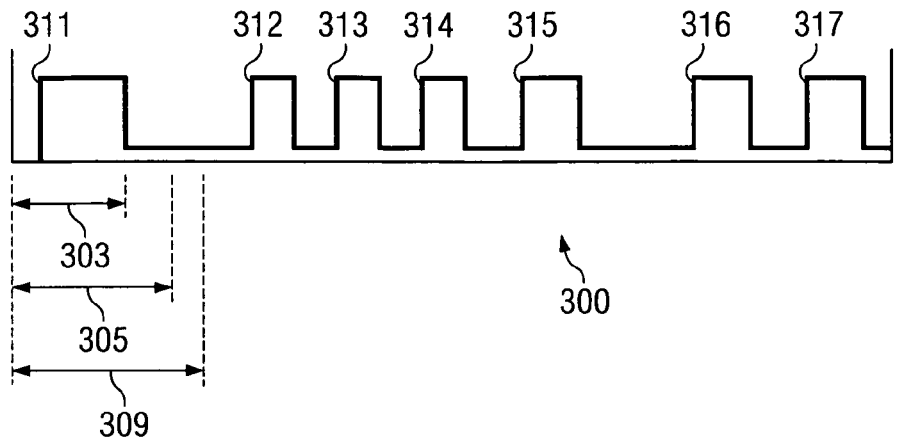
FIG. 3 shows a timing diagram in accordance with an illustrative embodiment of the present invention.

FIG. 3 shows a timing diagram in accordance with an illustrative embodiment of the present invention. Signal 300 is an example of a signal that may issue from touch circuit in response to a threshold achieved at the touch plate. Conversely, a controller may receive signal 300. The controller may be, for example, controller unit 223 of FIG. 2A. The threshold may be a preset level of capacitance. Signal 300 is a popular cadence of strokes known as, "shave and a haircut, two bits", that is often used associated with knocking on doors. Controller unit 223 in FIG. 2A may measure durations of intervals between the rising edges, hereinafter, "edges", of the signal to see if the signal that arrives satisfies a timing criteria. For example, an interval between two edges that is longer than minimum interval 303 may also be smaller than a maximum interval 309. An initial tolerance may comprise a range of intervals bounded by limits, for example, minimum interval 303, and maximum interval 309. If these conditions of the initial tolerance are met, for example, as occurs with exemplary interval 305, then further processing may occur to identify whether an addition criterion is met in additional edges, for example, a third edge 313. A signal that has two edges between the minimum interval and maximum interval 309 meets an initial tolerance.

The relative terms 'first', 'second', etc., each denote the correlation of each edge to a tolerance of an idealized signal. If a third edge of the signal arrives but falls outside the expected criteria or tolerance, then the third edge is reassigned or relabeled the first edge, as the embodiment seeks to find additional edges, beyond the now-first edge, that match the sought-for pattern. The edge in this embodiment is the portion of the signal where a voltage raises above a certain threshold. It is appreciated that other embodiments may detect edges as a transition from above a threshold to below a threshold, that is, as may occur when a conductor is removed from the proximity of the touch plate.

As few as three edges of the signal may be checked for meeting an initial tolerance and meeting a match tolerance. However, checking more edges may permit an embodiment to reject similar inputs generated by unintentional contact with the touch plate. Complexity of the matching criteria correlates inversely with the probability that a random process triggers a match. For purposes of matching the "shave and a haircut, two bits" criteria, exemplified as signal 300 in FIG. 3, two edges are measured to see if initial tolerance is met, and the remaining five edges are measured to see if the match tolerance is met. A match tolerance is at least one pair of bounding limits. For example, the match tolerance may be determined if a third and successive edges arrive within a fixed interval proportional to a time scale. Controller unit 223 in FIG. 2A may flexibly determine a time scale consistent with the time measured between two edges that arrived within the initial tolerance. For example, if controller unit 223 in FIG. 2A received first edge 311 and second edge 312 at an interval near minimal interval 303 apart, then the time scale would be accordingly short. On the other hand, if the first two edges arrived at near maximum interval 309 apart, then the time scale would be accordingly long. Signal 300 has a first interval, between first edge and second edge. Signal 300 has a second interval, between second edge 312 and third edge 313. This embodiment determines an overall signal matches the idealized signal if the first interval and the second interval substantially vary, for example, in this case, first interval is 100% longer than second interval.

The time scale may be a number or factor representing some multiple of the actual interval received, for example, between first edge and second edge, divided by the smallest interval allowable for a match, that is, minimum interval 303. The time scale, thus, is a kind of metronome for setting the pacing of expected additional edges. FIG. 3 shows the ratio between exemplary interval 305 and minimum interval 303 to be about 1.4, which is the time scale. As has been previously noted, signal 300 is an example of a user input that matches criteria relating to cadence. There are many variables among groups of users that permit the user to enter slight variations in the signal. Nevertheless, embodiments may still match the incoming signal to criteria. In addition, there is a host of other popular rhythms and cadences that may serve as a template for establishing various preset minimum intervals and maximum intervals, for example, minimum interval 303. Other rhythms could apply timing rules from the song 'happy birthday', among others, to serve as criteria for actuating a device.

Additional edges may be determined as meeting a criterion if the edges arrive within a specified interval limit from a prior edge. A match interval includes a criterion established after multiplying a pair of base limits by a time scale. The controller may have a multiplier circuit to perform multiplication and optionally division. For example, the interval expected between second edge 312 and third edge 313 is a base minimum interval of 0.5 seconds and a base maximum interval of 1.0 seconds, wherein the base minimum interval and the base maximum interval are base limits. Consequently, the match interval would have 0.7 and 1.4 second limits, respectively, for the minimum interval and maximum interval for arrival times an edge could arrive and satisfy a criterion to accept the edge as third edge 313. If an edge arrives inside those limits, then controller unit 223 in FIG. 2A determines the edge meets the match interval, and assigns the edge to the third edge in the sequence of expected edges. If the edge arrives outside those limits, then the controller unit 223 in FIG. 2A determines that the edge does not meet the match interval, and optionally assigns the edge to the first edge in the sequence of expected edges.

Thus, if the remaining edges, third edge 313, fourth edge 314, fifth edge 315, sixth edge 316, and seventh edge 317 all arrive within tolerances, the controller actuates the controlled device, for example, an LED. Actuation means that the controller commands the controlled device to change state. For an LED, this could mean toggling from on to off, or from off to on.

Controller may revise tolerances in accordance with a revised time scale. The revised time scale accommodates people who have difficulty establishing a rhythm. A revised time scale is established by resetting the time scale to be the ratio between an actually received interval and the base minimum interval of the last two received edges.

On the other hand, if any one edge arrives outside the tolerance expected, then the controller may begin recovery from what are apparent random signals, that is, signals that are either unintentional, or are intentionally entered by someone that does not know the correct code or cadence.

Figure 4:
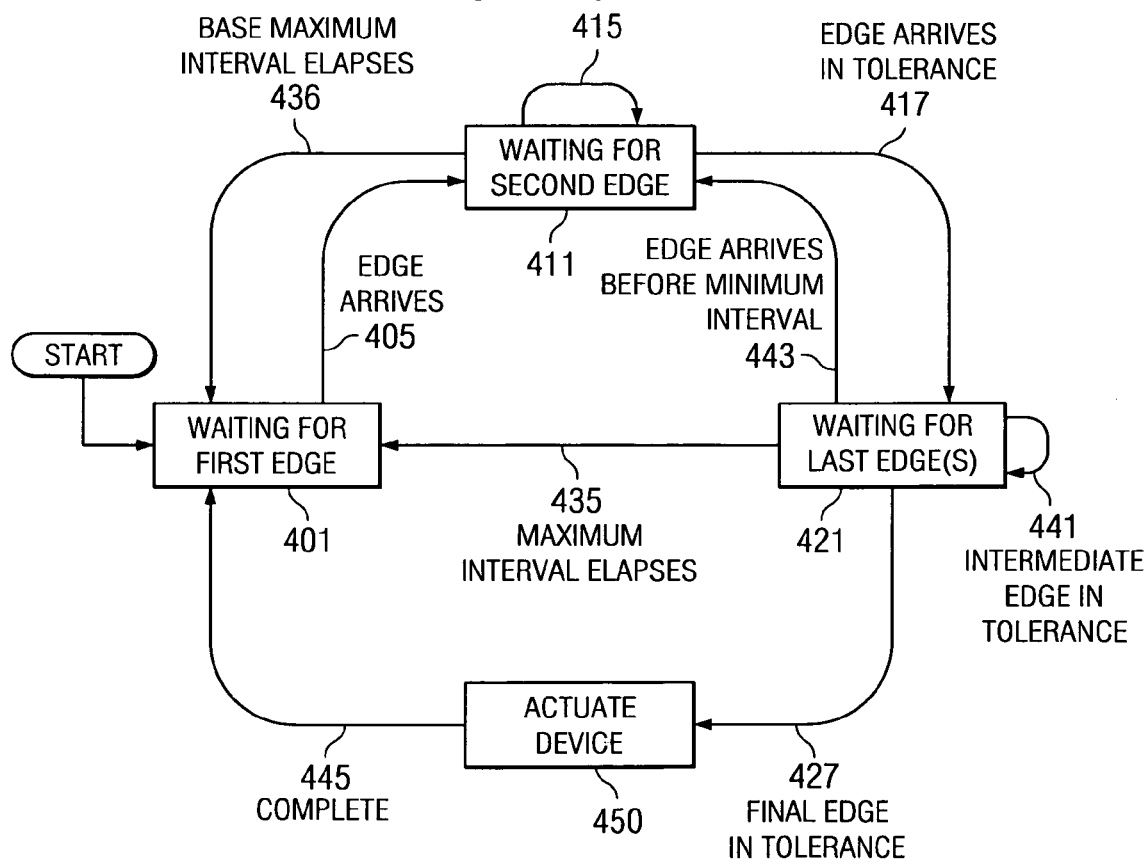
FIG. 4 shows a state diagram in accordance with an illustrative embodiment of the present invention.

FIG. 4 shows a state diagram in accordance with an illustrative embodiment of the present invention. A controller, begins by entering a "waiting for first edge" state 401. Arrival of a first edge or signal connotes transition 405, wherein the device enters "waiting for second edge" state 411. Signals are now determined to see if the first and the second edges arrive within an initial tolerance. Arrival of a signal before a base minimum interval 415 connotes a transition where the "waiting for second edge" state 411 continues. However, if a signal arrives within tolerance 417, then transition occurs to "waiting for last edge(s)" state 421. A third edge arriving before a minimum interval of the third edge 443 transitions to "waiting for second edge" 411. If a maximum interval elapses prior to arrival of a third or later edge 435, circuit transitions to "waiting for first edge" 401. If an intermediate edge arrives between minimum interval and maximum intervals for the remaining edge or edges 441, circuit transitions to "waiting for last edge(s)" state 421. However, if a final edge arrives between minimum interval and maximum interval for the final edge 427, circuit transitions to actuate device state 450, wherein an additional controlled circuit is actuated. The controlled circuit completes actuating 445, thus circuit transitions to "waiting for first edge" 401. A controller may match an arbitrary number of edges to meet a pre-set pattern, depending on how complex a waveform the designer wants to match. The circuit falls back to waiting for first edge 401 any time a maximum interval elapses after receiving an edge of a signal. For example, while in "waiting for second edge" 411 state, circuit may detect time elapsing to a base maximum interval 436.

Figure 5:
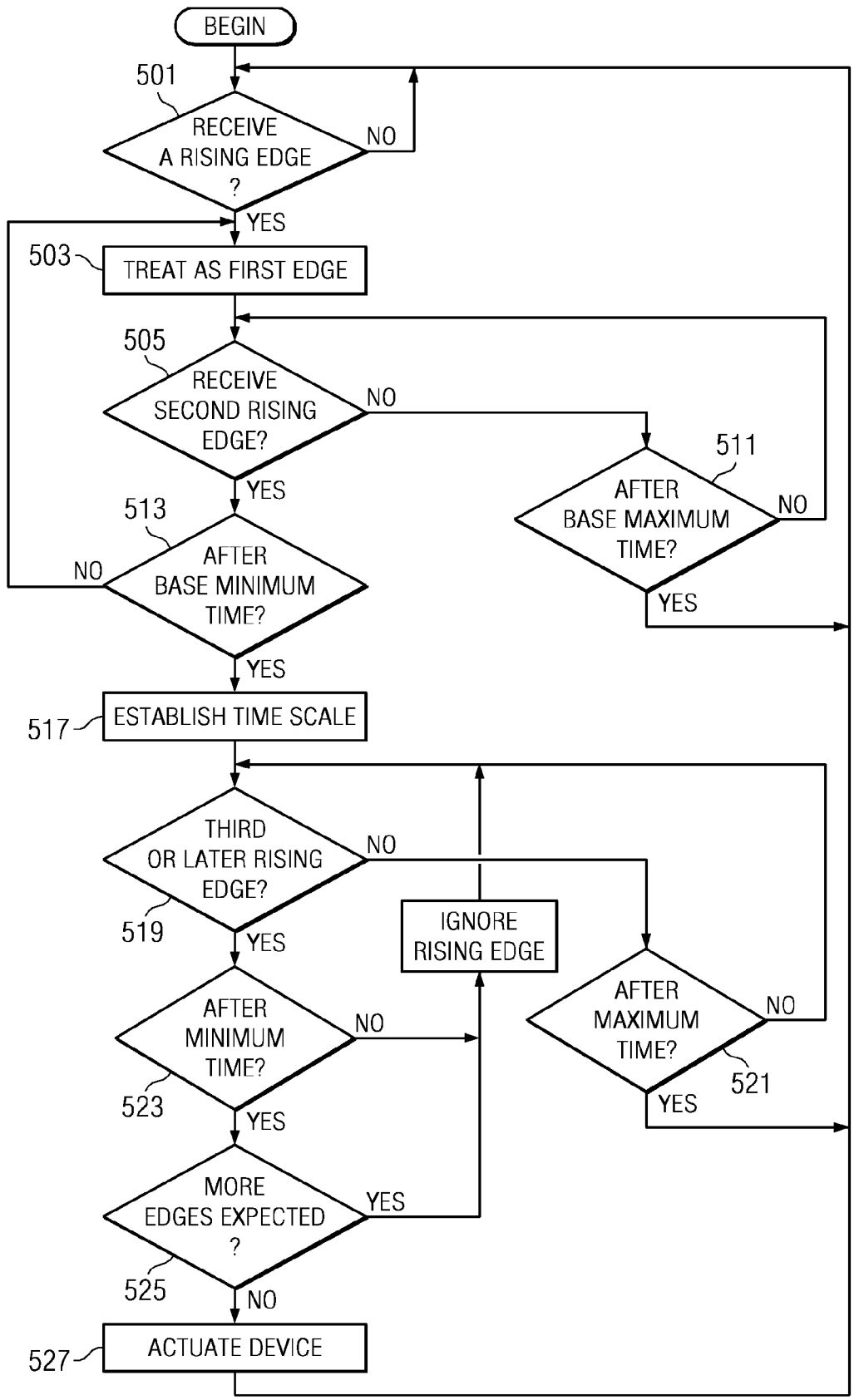
FIG. 5 shows a flow chart in accordance with an illustrative embodiment of the present invention.

FIG. 5 shows a flow chart in accordance with an illustrative embodiment of the present invention. A controller determines whether the controller received rising edge (step 501). If no edge arrived, the controller continues to determine whether the controller received rising edge (step 501). Otherwise, the controller treats the signal as a first edge (step 503). The controller determines if a second rising edge is received (step 505). If second rising edge 505 is not received, controller determines if a base maximum time has elapsed since the last edge arrived (step 511). If the time has not elapsed after the base maximum time, controller continues step 505. Otherwise, too much time has passed, and controller goes back to step 501.

If a second edge arrives at receive step 505, that is, a yes determination, controller determines if the edge arrived after the base minimum time (step 513). Provided the determination is affirmative, controller establishes a time scale (step 517). The time scale operates as a factor to scale match tolerance parameters accordingly. A negative determination at step 513 causes controller to resume looking to receive a rising edge at step 505.

A third and remaining edges may be determined as qualifying for criteria with steps 519 through 525. The controller determines if the controller has received a rising edge (step 519). If a third or later edge is not received, controller determines if a maximum time has elapsed since the last edge arrived (step 521). If the time has not elapsed after the maximum time, controller continues step 519. Otherwise, too much time has passed, and controller goes back to step 501.

If a remaining edge arrives at step 519, that is, a yes determination, controller determines if the edge arrived after the minimum time (step 523). Provided the determination is affirmative, controller determines if criteria requires more edges (step 525). If more edges are expected, controller returns to step 519. Otherwise, the signal has satisfied all criteria, and controller actuates the device (step 527).

Figure 6:
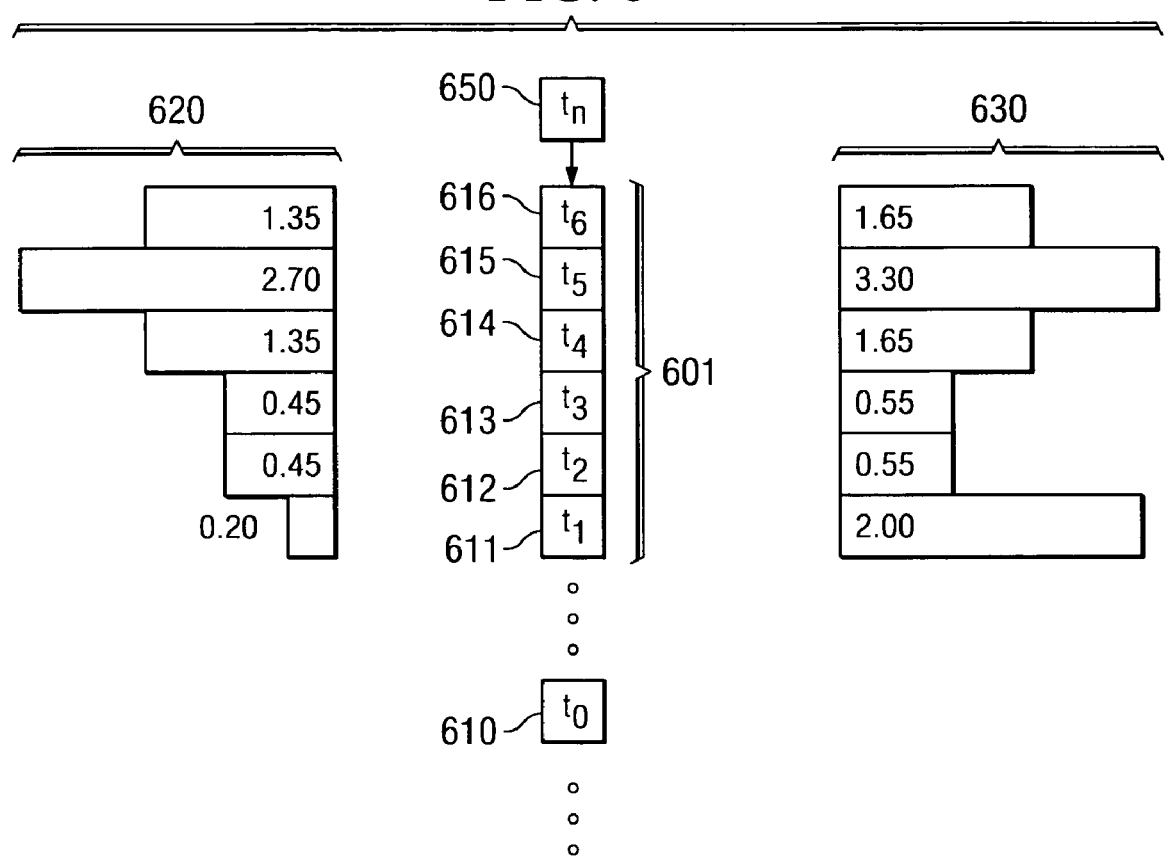
FIG. 6 shows a series of minimum intervals and maximum intervals to use for determining matching criteria in accordance with an illustrative embodiment of the present invention.

FIG. 6 shows an illustrative embodiment of the present invention that stores the actual intervals between edges in first in first out register 601 or FIFO register. In the example of 'shave and a haircut, two bits', there are six intervals to check for, $t_1$ through $t_6$. FIFO register 601 fills at first element 611. The next interval is stored at second element 612. Similarly third element 613, fourth element 614, fifth element 615, and sixth element 616 are filled with additional intervals as they are recorded. When sixth element 616 is available, the controller may validate all intervals to determine if all intervals in FIFO register 601 are within tolerances.

FIG. 6 shows tolerances as set of minimum intervals 620 and set of maximum intervals 630. First minimum interval 621 and first maximum interval 631 may be predetermined as a wide interval of 0.20 seconds and 2.00 seconds respectively. This permits a controller to measure a wide range of human rhythms as within tolerances.

The remaining minimum intervals and maximum intervals may be set to narrower ranges base on a time scale established by the actual first interval stored in first element 611.

Provided FIFO register 601 is filled, and one or more actual intervals fail to meet the criteria, an additional interval may be recorded when one or more additional edges occur. The additional interval is shown as $t_n$, which may be stored in register 650. FIFO register 601 shifts the values stored in all elements such that the controller discards the current value of first element 611 to form discarded value 610. Like all FIFO registers, the oldest stored value 610 is discarded or otherwise processed. The first element receives the value of the second element 612. Second element 612 receives the value of third element 613. The process continues until sixth element 616 receives the value of the additional interval.

The controller may revise the allowable criteria for minimum interval 622 through minimum interval 626 to reflect that a hypothetical first interval stored in first element 611 should set the pace for the remaining intervals. The controller sets minimum interval 622 accordingly low, provided first interval stored in first element 611 is within tolerance but at the low end of the range of tolerances. The controller proportionally reduces the remaining minimum intervals.

Similarly, the controller may revise the allowable criteria for maximum interval 632 through maximum interval 636 to prepare for intervals in step with the rhythm established in first interval stored in first element 611. Once again, the controller checks all FIFO register elements to determine if they, collectively, meet the criteria.

In addition to proportionally reducing, the controller may proportionally increase the criteria when, for example, the first interval stored in first element 611 is at the higher end of the range established by first minimum interval 621 and first maximum interval 631.

If the controller determines that all criteria are met, the controller actuates the controlled device. The controller resets FIFO register 601, for example, to store zero values in each element. As new intervals arrive, the controller fills FIFO register 601 beginning with first element 611.

The illustrative embodiments shown in FIG. 5 and FIG. 6 may each be implemented as a state machine, wherein one state machine may detect a series of edges that meets criteria. In addition, to a single state machine, an embodiment may employ multiple state machines each having distinct criteria from each other. Each state machine may detect distinct signal patterns. For example, one state machine may seek a match for "shave and a haircut, two bits", while another may seek a match for a portion of the rhythm associated with the "happy birthday" song. Thus, several state machines may activate different functions of a controlled device upon detecting distinct input cadences.

Referring again to FIG. 2A, touch circuit 221 of FIG. 2A may also provide hysteresis circuit or debounce circuit, wherein an input signal is provided to a debounce circuit. Debounce circuit forms input signal into a more stable, but slightly delayed corresponding rise in an output signal.

Touch plate 211 of FIG. 2A may be comprised of dielectric having an outer conductive surface and an inner conductive surface. The outer conductive surface may be a metal sheet, for example. The inner conductive surface may be connected to ground or a base voltage of the overall controlled device including actuator. The outer conductive surface electrically connects to touch circuit 221. The outer conductive surface is so connected to touch circuit 221, that touch circuit 221 responds near synchronously with human movements provided by human inputs to produce edges. Human movements include movement of a hand nearer and farther from the outer conductive surface.

Emitter 219 of FIG. 2A may be an LED. Other light emitters such as fluorescent bulbs and automobile lamps may operate as emitter 219. In addition, emitter may be a transmitter, for example, for operating garage doors remotely. In other words, the transmitter may transmit an actuate signal.

Thus, a user of a mobile device may have the benefits of a durable switch and avoid the majority of spurious actuations of the controlled device.

A user may establish the criteria for minimum intervals and maximum intervals. For example, a dialog may be disclosed to a user in a manual, which explains that an embodiment may respond to a training session by flashing the LED in a three flash sequence. Alternatively, other embodiments may provide a controller with a USB interface for uploading timing criteria to a modest flash memory device onboard the controller.

The circuit, as described above, is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method for actuating a mobile device having a touch plate comprising:
   receiving, by a controller unit operatively coupled with the touch plate, a signal from the touch plate including a first edge, a second edge and a third edge, wherein the first edge is a transition beyond a threshold;
   receiving the second edge of the signal after receiving the first edge of the signal, wherein the second edge is a transition beyond the threshold;
   responsive to receiving the second edge of the signal, determining whether the second edge was received within an initial tolerance associated with the receipt of the first edge;
   responsive to determining that the second edge was not received within the initial tolerance, restarting the method with the second edge as a new first edge of the signal received and waiting to receive a new second edge of the signal received;

responsive to determining that the second edge was received within the initial tolerance, receiving the third edge within a match tolerance, wherein the third edge is a transition beyond the threshold; and actuating a controlled device, responsive to receiving the second edge within the initial tolerance and responsive to receiving the third edge within the match tolerance.

2. The method of claim 1 further comprising:

establishing a time scale for additional signals, responsive to determining that the second edge was received within the initial tolerance wherein the match tolerance is based on the time scale.

3. The method of claim 2, wherein the match tolerance comprises at least one limit, and establishing the time scale comprises:

multiplying a base limit by the time scale to form the at least one limit.

4. The method of claim 2, wherein the match tolerance is a first match tolerance, further comprising:

receiving a fourth edge, wherein the fourth edge is a transition beyond the threshold; and determining whether the fourth edge was received within a second match tolerance.

5. the method of claim 4, wherein the controlled device is an access controlled device.

6. The method of claim 5, wherein actuating comprises: transmitting an actuate signal.

7. The method of claim 2, wherein actuating comprises: switching the controlled device.

8. A circuit for actuating a mobile device having a touch plate comprising:

a controller unit for receiving a signal from the touch plate including a first edge, a second edge and a third edge, the controller unit receiving the second edge after receiving the first edge, determining whether the second edge was received within an initial tolerance associated with receipt of the first edge responsive to receiving the second edge, restarting receipt of edges with the second edge as a new first edge of the signal received and waiting to receive a new second edge of the signal received responsive to determining that the second edge was not received within the initial tolerance, and receiving the third edge within a match tolerance responsive to determining that the second edge was received with the initial tolerance; and an actuator for actuating a controlled device, responsive the second edge within the initial tolerance and responsive to receiving the third edge within the match tolerance.

9. The circuit of claim 8 further comprising:

establishing a time scale for additional signals, responsive to determining that the second edge was received within the initial tolerance, wherein the match tolerance is based on the time scale.

10. The circuit of claim 9, wherein the match tolerance comprises at least one limit and establishing the time scale comprises:

a multiplier circuit for multiplying a base limit by the time scale to form the at least one limit.

11. The circuit of claim 9, wherein actuating comprises:

a transmitter for switching the controlled device.

12. The circuit of claim 11, wherein the controlled device is an access controlled device.

13. The circuit of claim 9 further comprising:

a touch circuit for producing edges near synchronously with human inputs, wherein touch circuit is operatively coupled with the controller unit.

14. A circuit for actuating comprising:

a touch plate;

a touch circuit for detecting a presence of a conductor extremely proximal to the touch plate, generating and transmitting edges of a signal; and a controller unit, wherein the controller unit receives edges of the signal and transmits an actuate signal based on receiving a first edge, receiving a second edge after receiving the first edge, determining whether the second edge was received within a first interval associated with receipt of the first edge responsive to receiving the second edge, restarting receipt of edges with the second edge as a new first edge of the signal received and waiting to receive a new second edge of the signal received responsive to determining that the second edge was not received within the initial tolerance, and receiving a third edge within a second interval responsive to determining that the second edge was received within the initial tolerance.

15. The circuit for actuating of claim 14 further comprising:

an emitter.

16. The circuit for actuating of claim 15, wherein the emitter is a transmitter.

17. The circuit for actuating of claim 16, wherein the second interval is within a tolerance based on the first interval.

18. The circuit for actuating of claim 15, wherein the second interval comprises a third interval.

19. The circuit for actuating of claim 15, wherein the touch circuit further comprises a debounce circuit.

20. The circuit for actuating of claim 14 wherein the touch plate comprises:

a metal sheet electrically connected to the touch circuit.

* * * * *